United States Patent [19]
Kothandaraman et al.

[11] Patent Number: 6,147,520
[45] Date of Patent: *Nov. 14, 2000

[54] INTEGRATED CIRCUIT HAVING CONTROLLED IMPEDANCE

[75] Inventors: Makeshwar Kothandaraman, Emmaus; Wayne E. Werner, Coopersburg, both of Pa.

[73] Assignee: Lucent Technologies, Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/993,209

[22] Filed: Dec. 18, 1997

[51] Int. Cl.[7] .................................................. H03K 5/22
[52] U.S. Cl. .............................. 327/77; 327/308; 327/513
[58] Field of Search .................................... 327/308, 513, 327/530, 538, 540, 541, 77; 326/30, 87

[56] References Cited

U.S. PATENT DOCUMENTS

| | | | |
|---|---|---|---|
| 4,237,405 | 12/1980 | Kellis | 315/307 |
| 5,194,765 | 3/1993 | Dunlop et al. | 327/112 |
| 5,243,229 | 9/1993 | Gabara et al. | 307/98 |
| 5,298,800 | 3/1994 | Dunlop et al. | 307/270 |
| 5,721,497 | 2/1998 | Novak | 326/30 |

FOREIGN PATENT DOCUMENTS 0718 887 A1  12/1995  European Pat. Off. ........ H01L 27/08

OTHER PUBLICATIONS

Publication Number 63179563, Date Jul. 23, 1988, Application No. 62012661, Application Date Jan. 21, 1987, Applicant NEC Corp., Inventor—Hara Takaaki, Int. Cl. H01L 27/04—Title: Integrated Circuit—Patent Abstract of Japan only.

"Ds90LV032 3V LVDS Differential Line Receiver", published by National Semiconductor, Dec. 1996, pp. 1–8.

"SN75LVDS86 Flatlink (TM) Receiver", published by Texas Instruments, SLLS268A—Mar. 1997, revised May 1997, pp. 1–14.

Primary Examiner—Kenneth B. Wells
Attorney, Agent, or Firm—James H. Fox; Mark A. Kurisko

[57] ABSTRACT

An integrated circuit includes a controlled impedance that remains relatively constant with respect to variations in processing and temperature. The controlled impedance comprises a fixed resistor in parallel with one or more switchable resistors having a resistance value greater than that of the fixed resistance. Control circuitry includes a reference current generator. The reference current is flowed through a tracking resistor formed of the same material (e.g., doped polysilicon) in the same fabrication process as the fixed resistor. Comparators are used to monitor the voltage across the tracking resistor, and control the switching of the switchable resistors in order to obtain a desired effective resistance. Use of the inventive technique to provide a transmission line termination impedance is described in an illustrative embodiment.

11 Claims, 2 Drawing Sheets

INTEGRATED CIRCUIT HAVING CONTROLLED IMPEDANCE

BACKGROUND OF THE INVENTION

1. Field of the invention

The present invention relates to an integrated circuit (IC) having a controlled on-chip impedance.

2. Description of the Prior Art

Most integrated circuit (IC) on-chip impedance circuits exhibit a large variation in value with variation in process, temperature and power supply voltage (e.g., $V_{dd}$) if they are passive, or with variation in common mode voltage if they are active. Many high speed signaling circuits use a low termination impedance (typically ~50 ohms) to terminate transmission lines. In one application, the Low Voltage Differential Signaling (LVDS) requires a 100 ohms termination impedance, and in addition this impedance needs to operate (i.e., remain linear) over a wide common mode range. Furthermore, when constructing terminating devices, it is desirable that this termination be realized on chip. Also, it is important that this impedance be controlled precisely to be as close to the transmission line impedance as possible. This impedance, when realized using sheet resistors exhibits a large variation due to process, temperature and power supply fluctuations. On the other hand, when active circuits are used a large variation is seen when the common mode voltage of the input signal changes. A simple way of combining the advantages of the active and passive solutions is desirable.

Various prior-art techniques have been devised to obtain controllable impedances; for example, resistors that have a value that can be set over a desired range of values. In one prior-art technique, illustrated in FIG. 1, resistors (R1 and R2) are connected in series, and paralleled with switches (SW1 and SW2). In operation, when it is desired to lower the series resistance between nodes 10 and 11, either or both of the switches SW1 and SW2 are closed, thereby effectively removing the associated resistor from the resistance path. In this manner, a total resistance of 0, R1, R2 or R1+R2 can be obtained. However, the resistance of the switches SW1 and SW2 when closed must also be taken into account if they are not small as compared to their associated resistor. In most cases, for this technique to be effective, the resistance of the switches should be less than 10 percent, and more typically less than 5 percent, of the value of the associated resistor. It is also known to use parallel MOS transistors to achieve a desired impedance, as for use in terminating a transmission line; see, for example, U.S. Pat. Nos. 5,243,229 and 5,298,800 coassigned herewith.

SUMMARY OF THE INVENTION

An integrated circuit includes a controlled impedance comprising a fixed resistor in parallel with at least one switchable resistor having a resistance value greater than that of the fixed resistor. Use of the inventive technique as a transmission line termination impedance is described in an illustrative embodiment.

DETAILED DESCRIPTION

Figure 1:
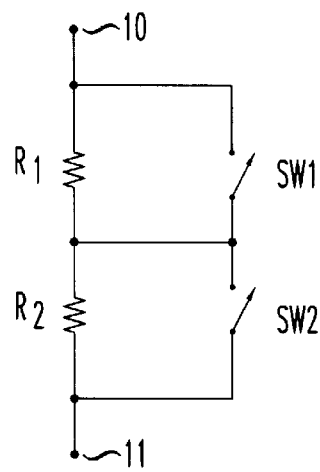
FIG. 1 shows a prior-art controlled resistance.
Figure 2:
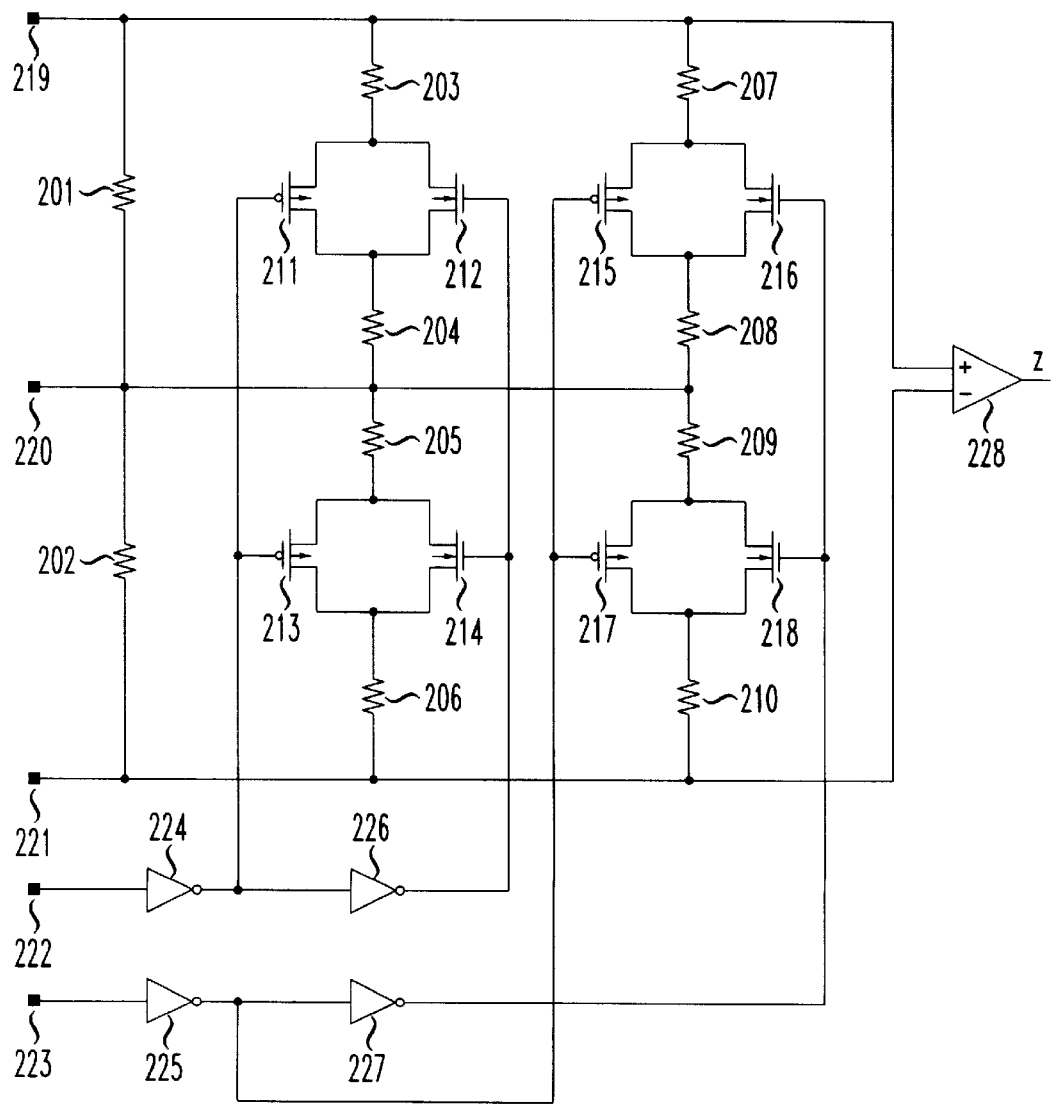
FIG. 2 shows an embodiment of the inventive controlled resistance.

The following detailed description relates to an integrated circuit having a controlled impedance that includes a fixed resistance in parallel with a switchable resistance having a resistance value greater than that of the fixed resistance. Referring to FIG. 2, in a typical embodiment of the invention, an array of sheet resistors (201–210) and transmission gates (211–218) is formed. The number of legs in the array depends on the desired accuracy of the impedance. The first leg of the array comprises fixed resistances 201 and 202, typically formed from a sheet of doped deposited polysilicon, whose value is set marginally (e.g., 35%) higher than the desired value. A control circuit, discussed below, dynamically monitors the value of the resistances across bondpads 219–220 and 220–221, and turns on/off additional legs of transmission gates/resistors to control the impedance precisely. When all of the transmission gates are "off", the impedance seen across bondpads 219–220, and also 220–221, will be equal to that of resistors 201 and 202, respectively, being 60 ohms in the illustrative case. In the second leg of the array, the switched resistors 203, 204, 205 and 206 each have a nominal value of 160 ohms, and are switched by MOS transistors 211, 212, 213 and 214, which each have a nominal "on" resistance of 80 ohms. In the third leg of the array, the switched resistors 207, 208, 209 and 210 each have a nominal value of 80 ohms, and are switched by MOS transistors 215, 216, 217 and 218 that each have a nominal "on" resistance of 40 ohms.

It can be seen that the value of these switched resistors is large as compared to the fixed resistors 201, 202. Furthermore, the value of the "on" resistance of the associated MOS transistors is significant in the illustrative case, and in some cases even larger (i.e., 80 ohms) than the valued of the fixed resistors 201 and 202 (60 ohms). Therefore, the inventive technique contrasts with typical prior-art schemes that switch on/off resistors in series with the fixed resistors. Such prior-art schemes need relatively large transmission gates in order to obtain a suitably low "on" resistance of the switches than a scheme that turns on/off resistors in parallel, especially when the value of the desired resistance is low. For example, simulations reveal that a maximum variation of as low as 9% may be obtained on a 100 ohm impedance realized using a total of 3 legs of polysilicon sheet resistors and 2 digital control signals (T0, T1).

In operation, a desired value of the termination resistor is 50 ohms plus or minus 10 percent; that is, a termination resistance in the range of 45 to 55 ohms is desired in the illustrative case. However, the integrated circuit fabrication process can typically cause the resistance of the polysilicon resistors to vary as much as plus or minus 25 percent from the nominal value. Therefore, resistors 201 and 202 can vary from 45 to 75 ohms. If they are 45 ohms, then this is within the acceptable range of termination resistances. However, if the resistors are greater than 55 ohms, the switched resistors in either the first or second legs, or both, may be turned on to provide a parallel resistance across the bondpads. This may be accomplished as follows:

(1) When the digital control signals T0 and T1 are low, the inverters 224 and 225 place a high voltage on the gates of p-channel devices 211, 213, 215 and 217, placing them in the "off" (high impedance) state. Similarly, the inverters 226 and 227 place a low voltage on the gates of n-channel devices 212, 214, 216 and 218, placing them in the "off" state also. Therefore, no additional resistance is provided in parallel with 201 and 202.

(2) When the digital control signal T0 goes high while T1 remains low, the inverters cause transistors 211, 212, 213 and 214 in the second leg to be turned "on", resulting in a resistance of nominally 400 ohms in first leg to be placed in parallel with the fixed resistors 201 and 202.

(3) When the digital control signal T1 goes high while T0 remains low, the inverters cause transistors 215, 216, 217 and 218 to be turned "on", resulting in a resistance of nominally 200 ohms in the second leg to be placed in parallel with the fixed resistors 201 and 202.

(4) When the digital control signals T0 and T1 are both high, the resistors in both the first and second legs are placed in parallel with the fixed resistors 201 and 202.

It can be seen that as T0 and T1 go high, either singly or in combination, the effective impedance seen across the input bondpads is reduced as compared to that provided by the fixed resistors. With the nominal resistance values shown, by applying the appropriate control signals T0 and T1, an effective termination resistance in the desired range of 45 to 55 ohms may be obtained regardless of the variation in the polysilicon sheet resistance over a range of plus or minus 25 percent.

Figure 3:
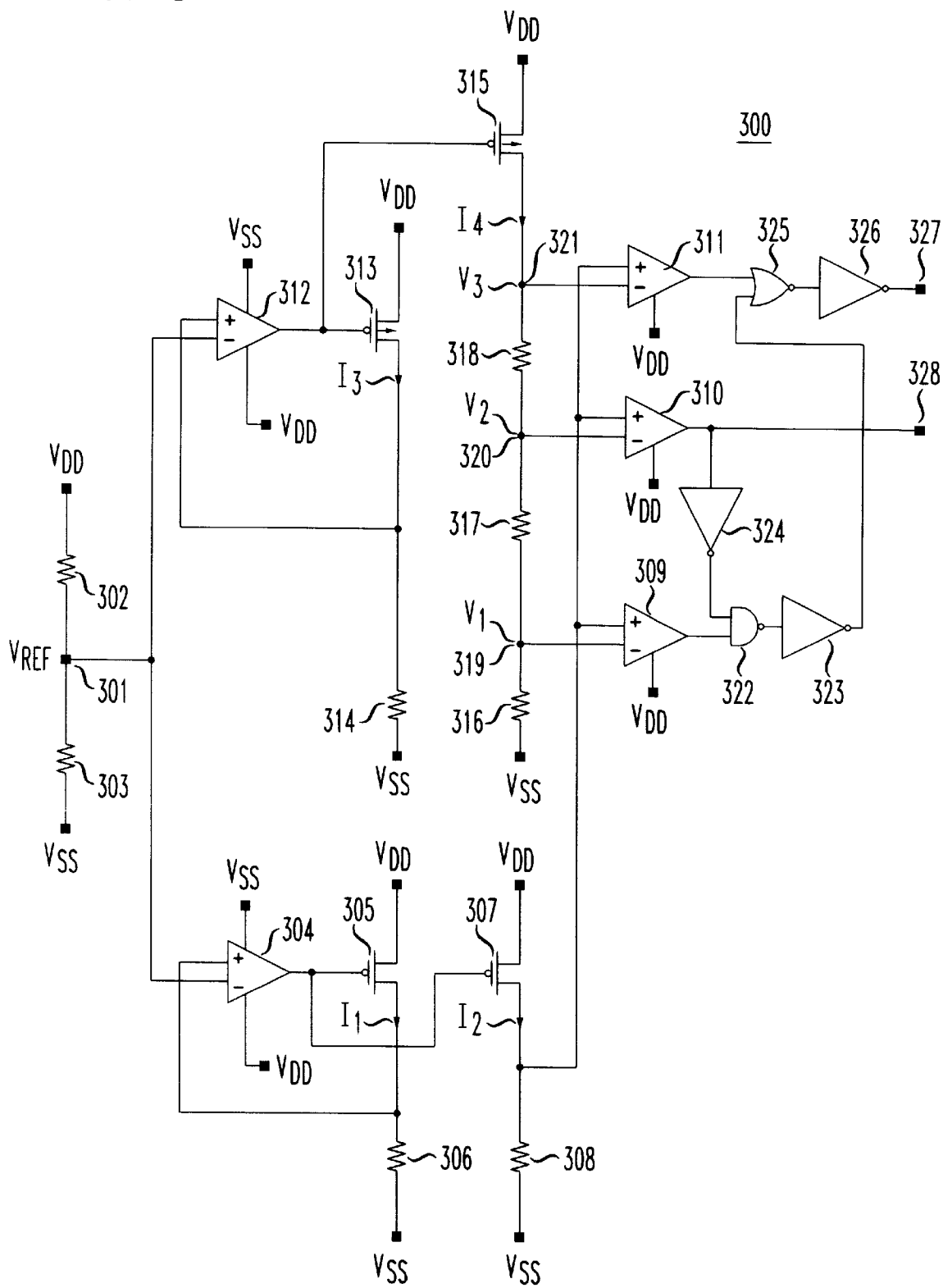
FIG. 3 shows an embodiment of control circuitry suitable for use with the controlled resistance of FIG. 2.

The digital control signals T0 and T1 may be generated by reference circuitry 300 shown in FIG. 3, or by other means as will be apparent to persons of skill in the art. A reference voltage $V_{REF}$ is applied to node 301, by resistor dividers 302 and 303 in the illustrative case. If desired, the reference voltage may be constant with respect to variations in power supply voltage, temperature, and the integrated circuit fabrication process, as when generated by a bandgap reference. However, that is not necessary, and $V_{REF}$ may be generated by a variety of on-chip or external sources.

In operation, the operational amplifier 304 receives $V_{REF}$ at its inverting input, and causes a first reference current $I_1$ to flow through transistor 305 and reference resistor 306. The reference resistor 306 is typically located externally to the IC on which the reference circuit 300 is formed, to provide for relative independence of temperature and processing effects on its resistance. A second reference current I2 is produced by transistor 307 and tracking resistor 308, with the value of I2 being scaled a desired value with respect to $I_1$ according to the ratio of the size of transistor 307 to transistor 305. The tracking resistor 308 is located on the same IC as the circuit 300, as is fabricated of the same material (doped polysilicon in the illustrative case) and with the same process steps as the fixed resistors shown in FIG. 2. Therefore, the current I2 produces a voltage $V_{COMP}$ that reflects variations in resistance of tracking resistor 308, and the voltage $V_{COMP}$ is applied to the non-inverting inputs of comparators 309, 310 and 311.

The reference voltage $V_{REF}$ is also applied to the inverting input of operational amplifier 312, producing an amplifier output voltage that causes transistor 313 to flow a current $I_3$ through resistor 314. The current $I_3$ is scaled by transistor 315, which causes current $I_4$ to flow through the string of resistors 316, 317 and 318, producing scaled reference voltages $V_1$, $V_2$ and $V_3$ on nodes 319, 320 and 321, respectively. The resistors 314, 316, 317 and 318 should be the same type (e.g., doped polysilicon), in order to cause the scaled references voltages to track $V_{REF}$ with variations in IC operating temperature and variations in the IC fabrication process. It can be seen that when $V_{COMP}$ is less than $V_1$, $V_2$ and $V_3$, the outputs of comparators 309, 310 and 311 are low, producing low voltage signals T0 and T1 on output nodes 327 and 328, respectively. This condition is produced when the resistance of tracking resistor 308 is relatively low, and results in no additional resistors being provided in parallel with the fixed resistors 201 and 202, as noted above. Since the resistor tracking 308 is formed of the same material (e.g., a doped deposited polysilicon layer) and patterned with the same lithography and etching steps as those that form the resistors 201 and 202, it follows that these fixed resistors will also be relatively low with respect to their expected tolerance range. Hence, it is appropriate that no additional resistors be provided in parallel with them.

In a similar manner, it can be seen that when $V_{COMP}$ is greater than V1 but less than V2, the output of comparator 309 will be high and the outputs of comparators 310 and 311 will be low, so that T0 is high and T1 is low. Similarly, when $V_{COMP}$ is greater than V2 but less than V3, the outputs of comparators 309 and 310 are both high, so that T1 is high and T0 is low. Finally, when $V_{COMP}$ is greater than V3, all the comparator outputs are high, and both T0 and T1 are placed in the high voltage state by the logic gates. This last state occurs when the resistance of the tracking resistor 308 is at the high end of its range, and so it is desirable to place all the switchable resistors of FIG. 2 in parallel with the fixed resistors. It can be seen that since $V_{COMP}$ reflects variations in the resistance of the tracking resistor 308 due to temperature and processing variations, that the control circuitry causes the switchable resistors to be placed in parallel with the fixed termination resistors as required to compensate for these variations and obtain the desired resistance.

The present invention may be used in a variety of applications that require termination resistors, and provides an accurate on-chip resistance without the use of expensive techniques such as resistor trimming, etc. For example, a balanced center-tapped termination requiring two resistors has been shown in FIG. 2, but a single-resistor termination may advantageously use the inventive technique. Furthermore, some applications require an accurate internal on-chip resistor that is not directly contacted by an external device, and the present invention may be used in that case also. The physical size of the circuit may be made small even when realizing a low impedance(~100 ohms). Use of this circuit reduces the pin count substantially in chips that use high speed signaling, since no external termination resistors need to be used. The control signals used, being digital, need not be shielded against noise with ground lines in layout. Various other advantages and applications of the present invention will be apparent to persons of skill in the art.

We claim:

1. An integrated circuit having a controllable impedance, said impedance comprising a first resistor formed of a given material and having a nominal resistance value greater than the upper limit of a desired tolerance range of resistance for said first resistor, and a second resistor switchably coupled in parallel with said first resistor;

and further having a tracking resistor formed of said given material in the same fabrication process that forms said first resistor, and control circuitry that causes said second resistor to be switched in parallel with said first resistor if said tracking resistor has an actual resistance value greater than the upper limit of an expected resistance range for said tracking resistor.

2. The invention of claim 1 wherein said control circuitry comprises a first comparator (309) for comparing a comparison voltage ($V_{COMP}$) developed across said tracking resistor (308) to a first reference voltage ($V_1$), and for generating a first control signal (T0) that causes said second resistor to be switched in parallel with said first resistor if said comparison voltage is greater than said first reference voltage.

3. The invention of claim 2 wherein said integrated circuit further has a third resistor switchably coupled in parallel with said first resistor, and said control circuitry further comprises a second comparator (310) for comparing said comparison voltage ($V_{COMP}$) to a second reference voltage ($V_2$), and for generating a second control signal (T1) that causes said third resistor to be switched in parallel with said first resistor if said comparison voltage is greater than said second reference voltage.

4. The invention of claim 3 wherein said control circuitry further comprises a third comparator (311) for comparing and comparison voltage ($V_{COMP}$) to a third reference voltage (V3), whereby said control circuitry generates both said first control signal (T0) and said second control signal (T1) that causes both said second resistor and said third resistor to be switched in parallel with said first resistor if said comparison voltage is greater than said third reference voltage.

5. The invention of claim 1 wherein said control circuitry includes a current source that causes a current (I1) to flow through said tracking resistor, with said current being relatively constant with respect to changes in integrated circuit operating temperature and variations in the fabrication process used to form the integrated circuit.

6. The invention of claim 5 wherein said current source comprises an operational amplifier (304) having an inverting input coupled to receive a reference voltage ($V_{REF}$), an output coupled to the control terminal of a current source transistors (305) having a first controlled terminal coupled to a first power supply voltage ($V_{DD}$) and having a second controlled terminal coupled to the non-inverting input of said operational amplifier, and further coupled through an external resistor (306) to a second power supply voltage ($V_{ss}$).

7. An integrated circuit having a controllable impedance, said impedance comprising a first resistor formed of a given material and having a nominal resistance value greater than the upper limit of a desired tolerance range of resistance for said first resistor, and a second resistor switchably coupled in parallel with said first resistor;

and further having a tracking resistor formed of said given material in the same fabrication process that forms said first resistor, and control circuitry that causes said second resistor to be switched in parallel with said first resistor if said tracking resistor has an actual resistance value greater than a the upper limit of an expected resistance range for said tracking resistor, wherein said control circuitry comprises a first comparator (309) for comparing a comparison voltage ($V_{COMP}$) developed across said tracking resistor (308) to a first to reference voltage ($V_1$), and for generating a first control signal (T0) that causes said second resistor to be switched in parallel with said first resistor when said comparison voltage is greater than said first reference voltage, wherein said control circuitry includes a current source that causes a current (I2) to flow through said tracking resistor, with said current being relatively constant with respect to changes in integrated circuit operating temperature and variations in the fabrication process used to form the integrated circuit, and wherein said current source comprises an operational amplifier (304) having an inverting input coupled to receive a reference voltage ($V_{REF}$), an output coupled to the control terminal of a current source transistors (305) having a first controlled terminal coupled to a first power supply voltage ($V_{DD}$) and having a second controlled terminal coupled to the non-inverting input of said operational amplifier.

8. A method of controlling an impedance on an integrated circuit, said impedance comprising a first resistor formed of a given material and having a nominal resistance value greater than the upper limit of a desired tolerance range of resistance for said first resistor, by steps comprising switching a second resistor in parallel with said first resistor if a tracking resistor on said integrated circuit formed of said given material in the same fabrication process that forms said first resistor has an actual resistance value greater than the upper limit of an expected resistance range for said tracking resistor.

9. The invention of claim 8 further comprising the steps of comparing a comparison voltage ($V_{COMP}$) developed across said tracking resistor (308) to a first reference voltage ($V_1$), and generating a first control signal (T0) that causes said second resistor to be switched in parallel with said first resistor if said comparison voltage is greater than said first reference voltage.

10. The invention of claim 9 further comprising the step of flowing a tracking current (I2) through said tracking resistor, with said tracking current being relatively constant with respect to changes in integrated circuit operating temperature and variations in the fabrication process used to form the integrated circuit.

11. The invention of claim 10 further comprising the step of generating said tracking current (I2) by flowing a first current (I1) from a current source (304, 305) through an external resistor (306), and scaling said tracking current to be proportional to said first current.

* * * * *